United States Patent
Yamamoto

(10) Patent No.: US 10,666,190 B2
(45) Date of Patent: May 26, 2020

(54) OSCILLATION CIRCUIT, CIRCUIT DEVICE, OSCILLATOR, ELECTRONIC APPARATUS, AND VEHICLE

(71) Applicant: SEIKO EPSON CORPORATION, Tokyo (JP)

(72) Inventor: Takehiro Yamamoto, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 106 days.

(21) Appl. No.: 15/914,324

(22) Filed: Mar. 7, 2018

(65) Prior Publication Data

US 2018/0269831 A1 Sep. 20, 2018

(30) Foreign Application Priority Data

Mar. 16, 2017 (JP) .................. 2017-051053

(51) Int. Cl.
*H03B 5/30* (2006.01)
*H03B 5/36* (2006.01)
*H03B 5/04* (2006.01)

(52) U.S. Cl.
CPC .............. *H03B 5/04* (2013.01); *H03B 5/364* (2013.01); *H03B 2200/0062* (2013.01)

(58) Field of Classification Search
CPC ... H03B 5/04; H03B 5/364; H03B 2200/0062
USPC .................. 331/116 R, 116 FE, 154, 158
See application file for complete search history.

(56) References Cited

U.S. PATENT DOCUMENTS

| | | | |
|---|---|---|---|
| 2009/0121799 A1 | 5/2009 | Ishikawa | |
| 2010/0321124 A1* | 12/2010 | Rangarajan | H03B 5/1228 331/117 FE |
| 2015/0180410 A1* | 6/2015 | Yamamoto | H03B 5/04 331/70 |

FOREIGN PATENT DOCUMENTS

| | | |
|---|---|---|
| JP | 2003-124214 A | 4/2003 |
| JP | 2009-124214 A | 6/2009 |
| JP | 2012-195646 A | 10/2012 |
| JP | 2012-227967 A | 11/2012 |

* cited by examiner

*Primary Examiner* — Richard Tan
(74) *Attorney, Agent, or Firm* — Oliff PLC

(57) ABSTRACT

An oscillation circuit that causes a vibrator to oscillate includes a bipolar transistor for oscillation, a P-type transistor having a gate to which a collector voltage of the bipolar transistor is input and a source to which a base of the bipolar transistor is connected, a first current source that supplies a current to the bipolar transistor, and a second current source that supplies a current to the P-type transistor.

20 Claims, 9 Drawing Sheets

OSCILLATION CIRCUIT, CIRCUIT DEVICE, OSCILLATOR, ELECTRONIC APPARATUS, AND VEHICLE

BACKGROUND

1. Technical Field

The present invention relates to an oscillation circuit, a circuit device, an oscillator, an electronic apparatus, and a vehicle.

2. Related Art

A feedback type oscillation circuit which uses a transistor is known as an oscillation circuit that causes a vibrator (oscillator) such as a crystal vibrator to oscillate. For example, a Pierce type oscillation circuit in which a feedback path is provided between a collector and a base of a bipolar transistor or between the base and an emitter of the bipolar transistor is known as the feedback type oscillation circuit. The oscillation circuit is described in, for example, JP-A-2009-124214 and JP-A-2012-195646.

In the oscillation circuit described above, if a collector voltage of the bipolar transistor for oscillation increases, there is a possibility that a circuit operation is influenced. For example, a bias voltage of a collector has a temperature characteristic, increasing at a low temperature. Accordingly, a transistor that supplies a bias current to the collector performs a linear operation at a low temperature, and thereby, there is a possibility that variation of an oscillation frequency occurs due to variation of a power supply voltage.

In a case where a MOS transistor is used as the transistor for oscillation, if a drain voltage of the transistor increases, there is a possibility that a circuit operation is influenced, in the same manner as above.

SUMMARY

An advantage of some aspects of the invention is to solve at least a part of the problems described above, and the invention can be implemented as the following forms or embodiments.

An aspect of the invention relates to an oscillation circuit, which causes a vibrator to oscillate, including a bipolar transistor for oscillation, a P-type transistor having a gate to which a collector voltage of the bipolar transistor is input and a source to which a base of the bipolar transistor is connected, a first current source that supplies a current to the bipolar transistor, and a second current source that supplies a current to the P-type transistor.

According to the aspect of the invention, feedback is performed between a collector and a base of a bipolar transistor through a source and a gate of a P-type transistor. Thereby, a collector voltage of the bipolar transistor is lowered by a gate-source voltage of the P-type transistor, and thus, it is possible to reduce an increase of the collector voltage of the bipolar transistor for oscillation.

In addition, in the aspect of the invention, when an operation point voltage of a base of the bipolar transistor is referred to as VB, an operation point voltage of a collector of the bipolar transistor is referred to as VC, and a gate-source voltage of the P-type transistor is referred to as VGS, VC=VB−VGS.

According to the aspect of the invention, an operation point voltage of a collector of a bipolar transistor is lower than an operation point voltage of a base by a gate-source voltage of a P-type transistor. Accordingly, a difference between a maximum value (a peak value of a sine wave) of a collector voltage and a power supply voltage can increase as compared with an oscillation circuit of related art. Thereby, it possible to secure a source-drain voltage of a transistor of a current source that supplies a bias current to the bipolar transistor, and to reduce a possibility that the transistor of the current source performs a linear operation.

In addition, in the aspect of the invention, the operation point voltage of the base of the bipolar transistor may have a negative temperature characteristic, and the gate-source voltage of the P-type transistor may have a negative temperature characteristic.

As described above, an operation point voltage of a collector of a bipolar transistor is lower than an operation point voltage of a base by a gate-source voltage of a P-type transistor. Accordingly, a negative temperature characteristic of the operation point voltage of the base of the bipolar transistor can be reduced by using a negative temperature characteristic of the gate-source voltage of the P-type transistor. Thereby, a possibility that a transistor of a current source performs a linear operation in a low temperature side of a temperature range which is used by an oscillation circuit, can be reduced.

In the aspect of the invention, the oscillation circuit may further include a resistance element that is provided between the collector of the bipolar transistor and the gate of the P-type transistor.

Impedance between a collector and a base of a bipolar transistor relates to an oscillation characteristic of an oscillation circuit (for example, negative resistance, stability of an oscillation loop, and the like). Accordingly, the oscillation characteristic (apart thereof) may be improved by providing a resistance element between the collector of the bipolar transistor and a gate of a P-type transistor. For example, it is possible to increase the negative resistance.

In the aspect of the invention, a source current of the P-type transistor may be variably adjusted.

With this configuration, an operation point of a base voltage of a bipolar transistor (a source voltage of a P-type transistor) can be adjusted by adjusting a source current of the P-type transistor. Thereby, it is possible to appropriately set the operation point voltage of the base of the bipolar transistor in accordance with a margin in which a transistor of a current source can maintain an operation in a saturation region.

In the aspect of the invention, the source current may be variably adjusted based on a power supply voltage.

With this configuration, a source current of a P-type transistor can be adjusted such that, as a power supply voltage is lower, an operation point voltage of a base of a bipolar transistor (a source of the P-type transistor) is lowered. Thereby, in a case where the power supply voltage is lowered, a possibility that a transistor of a current source performs a linear operation can be reduced.

Another aspect of the invention relates to an oscillation circuit, which causes a vibrator to oscillate, including an N-type transistor for oscillation, a P-type transistor having a gate to which a drain voltage of the N-type transistor is input and a drain to which a gate of the N-type transistor is connected, a first current source that supplies a current to the N-type transistor, and a second current source that supplies a current to the P-type transistor.

According to the aspect of the invention, feedback is performed between a drain and gate of an N-type transistor through a source and a gate of a P-type transistor. Thereby, a drain voltage of the N-type transistor is lowered by a gate-source voltage of the P-type transistor, and thus, it is possible to reduce an increase of a drain voltage of the N-type transistor for oscillation.

Still another aspect of the invention relates to an oscillation circuit, which causes a vibrator to oscillate, including a bipolar transistor for oscillation, and a circuit element that is provided between a collector and a base of the bipolar transistor, in which a base-emitter voltage of the bipolar transistor is a voltage having one temperature characteristic of a positive temperature characteristic and a negative temperature characteristic, and the circuit element generates a voltage having the other temperature characteristic between the collector and the base.

According to the aspect of the invention, a temperature characteristic of an operation point voltage of the base of the bipolar transistor (temperature characteristic of a base-emitter voltage of a bipolar transistor) can be reduced by using a temperature characteristic of a voltage generated between a collector and the base of the bipolar transistor by the circuit element. Thereby, a possibility that a transistor of a current source performs a linear operation in a temperature range which is used by an oscillation circuit can be reduced.

Still another aspect of the invention relates to a circuit device including an oscillation circuit described in any one of the above items.

In the aspect of the invention, a processing circuit that controls the oscillation circuit may be included.

Still another aspect of the invention relates to an oscillator including an oscillation circuit and the oscillation element which are described in anyone of the above items.

Still another aspect of the invention relates to an electronic apparatus including an oscillation circuit described in any one of the above items.

Still another aspect of the invention relates to a vehicle including an oscillation circuit described in any one of the above items.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments according to the invention will be described in detail. The present embodiments which will be described below do not unduly limit contents of the invention described in the appended Claims, and all the configurations which will be described in the present embodiments are not necessarily indispensable as means for solving the invention.

1. Comparative Example

Figure 1:
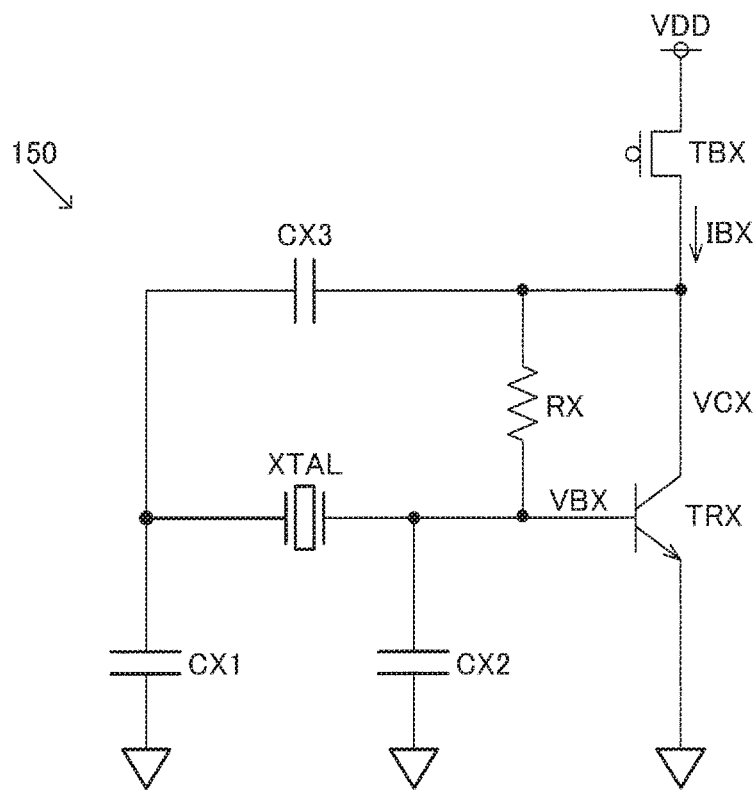
FIG. 1 is a comparative example of an oscillation circuit.

FIG. 1 is a comparative example of an oscillation circuit. An oscillation circuit 150 in FIG. 1 includes a bipolar transistor TRX, a resistor RX, capacitors CX1, CX2, and CX3, and a transistor TBX of a current source.

The resistor RX is connected between a base and a collector of the bipolar transistor TRX, and a series circuit of a vibrator XTAL (oscillator) and the capacitor CX3 is connected in parallel with the resistor RX. In addition, the capacitor CX1 is provided in one terminal of the vibrator XTAL, and the capacitor CX2 is provided in the other terminal. The vibrator XTAL is oscillated by feedback between the collector and the base of bipolar transistor TRX.

A bias current IBX is supplied from the transistor TBX (P-type transistor) of a current source to the bipolar transistor TRX. A path through which the bias current IBX flows is branched to the collector of the bipolar transistor TRX and the resistor RX. The bias current IBX branched to the resistor RX flows into the base of the bipolar transistor TRX through the resistor RX. Operation point voltages (bias voltages) of the collector and the base of the bipolar transistor TRX are determined by the bias current IBX, a size of the bipolar transistor TRX, and physical properties (process parameters) of the bipolar transistor TRX.

Figure 2:
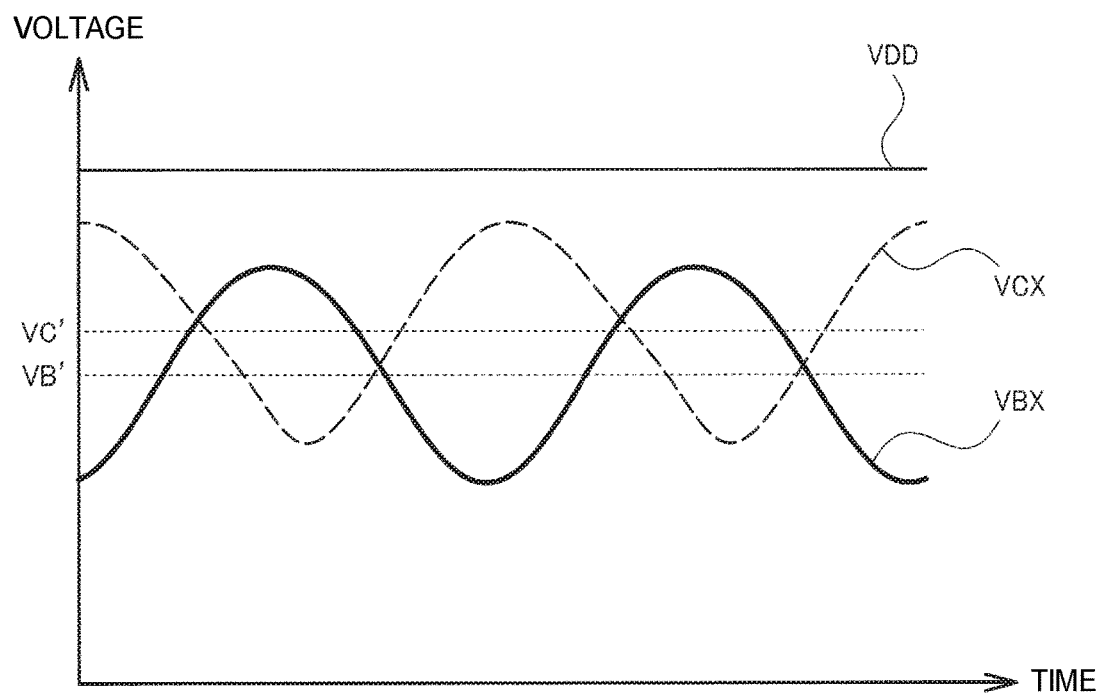
FIG. 2 is a waveform example of a collector voltage and a base voltage of a bipolar transistor in the comparative example.

FIG. 2 is a waveform example of a collector voltage and a base voltage of the bipolar transistor TRX when the vibrator XTAL oscillates.

A collector voltage VCX is a sine wave having an operation point voltage VC' as a reference (center), and a base voltage VBX is a sine wave having an operation point voltage VB' as a reference. The collector voltage VCX and the base voltage VBX are approximately opposite in phase.

As illustrated in FIG. 1, feedback is performed between the collector and the base through the resistor RX, and thus, the operation point voltage VC' of the collector is higher than the operation point voltage VB' of the base by a voltage across the resistor RX (base current×resistance value of resistor RX). Accordingly, there is a possibility that a difference between a maximum value (peak value of the sine wave) of the collector voltage VCX and a power supply voltage VDD is reduced. For example, in a case where the power supply voltage VDD is lowered, there is a possibility that the difference between the maximum value of the collector voltage VCX and the power supply voltage VDD is reduced, a source-drain voltage of the transistor TBX of a current source is reduced near the maximum value of the collector voltage VCX, and the transistor TBX performs a linear operation.

Figure 3:
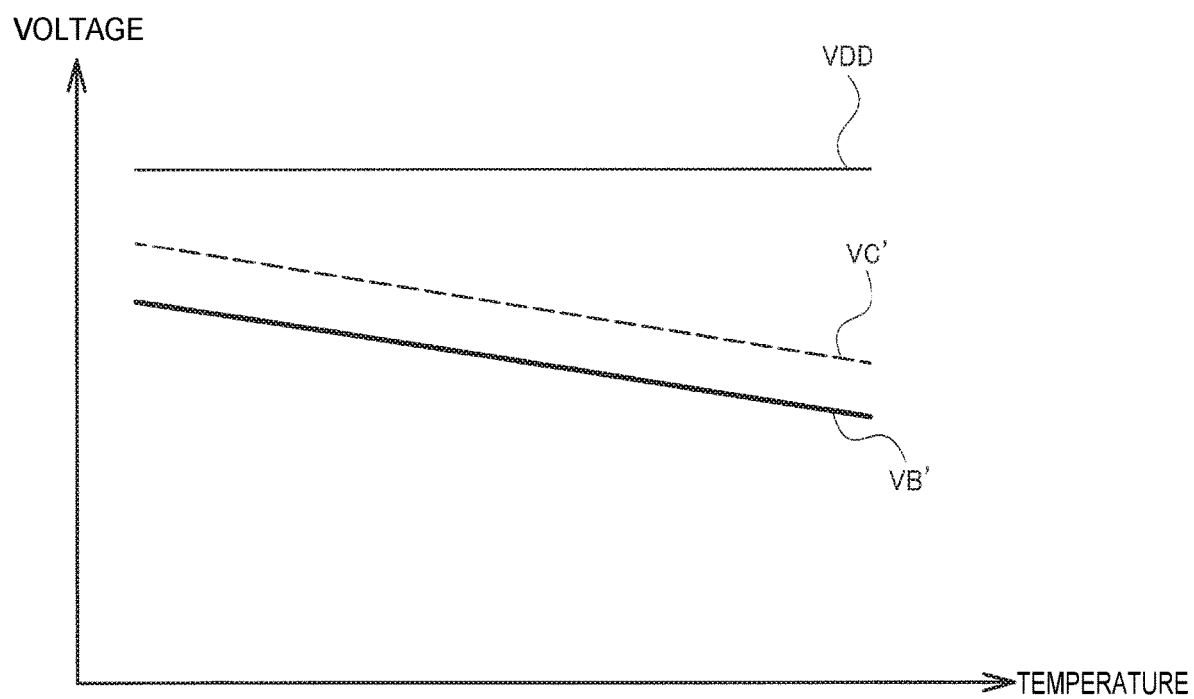
FIG. 3 is a temperature characteristic example of operation point voltages of a collector and a base of the bipolar transistor in the comparative example.

FIG. 3 is a temperature characteristic example of the operation point voltages of the collector and the base of the bipolar transistor TRX.

As illustrated in FIG. 3, the operation point voltage VC' of the collector is higher than the operation point voltage VB' of the base by a voltage across the resistor RX. The operation point voltage VC' of the collector has a negative temperature characteristic due to influence on a negative temperature characteristic of the operation point voltage VB' of the base, and the voltage becomes higher as the temperature becomes lower. When the vibrator XTAL oscillates, the collector voltage VCX vibrates by using the operation point voltage as a reference, and thereby, there is a high possibility that the transistor TBX of a current source performs a linear operation as the temperature becomes lower. As such, there is a higher possibility that the transistor TBX of a current source performs a linear operation due to the temperature characteristic of the bipolar transistor TRX.

Figure 4:
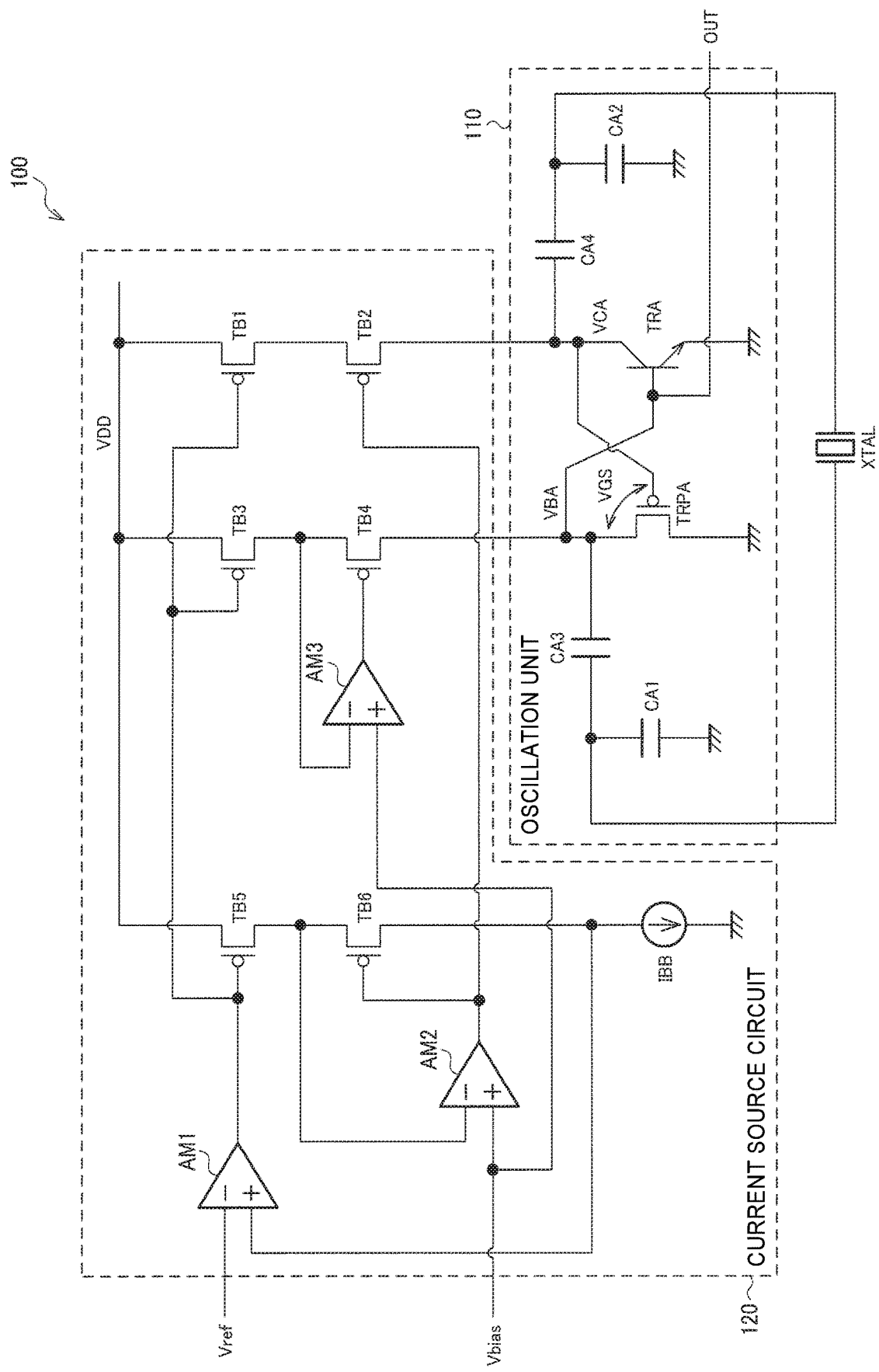
FIG. 4 is a configuration example of an oscillation circuit according to the present embodiment.

FIG. 4 illustrates a configuration example of an oscillation circuit according to the present embodiment. An oscillation circuit 100 illustrated in FIG. 4 includes an oscillation unit 110 (oscillation circuit body) and a current source circuit 120. The oscillation unit 110 includes a bipolar transistor TRA, a P-type transistor TRPA (first conductive type MOS transistor), and capacitors CA1 to CA4. The current source circuit 120 includes P-type transistors TB1 to TB6 (first conductive type MOS transistor), amplification circuits AM1 to AM3 (operational amplifier), and a current source IBB. The present embodiment is not limited to the configuration of FIG. 4, and various modifications such as omitting a part of configuration elements thereof and adding other configuration elements can be made.

First, the current source circuit 120 will be described.

A bias current generated by the current source IBB flows between sources and drains of the P-type transistors TB5 and TB6. The P-type transistors TB3 and TB1 are current-mirror-connected to the P-type transistor TB5, and a current flowing between the sources and the drains of the P-type transistors TB3 and TB1 is a mirror current of the current flowing through the P-type transistor TB5. A drain current of the P-type transistor TB3 (TB4) is supplied to a source of the P-type transistor TRPA and a base of the bipolar transistor TRA as a bias current. A drain current of the P-type transistor TB1 (TB2) is supplied to a collector of the bipolar transistor TRA as a bias current.

The amplification circuit AM1 controls a gate voltage of the P-type transistor TB5 and sets a drain voltage of the P-type transistor TB6 to a reference voltage Vref. The amplification circuit AM2 controls a gate voltage of the P-type transistor TB6 and sets a drain voltage of the P-type transistor TB5 to a reference voltage Vbias. The amplification circuit AM3 controls a gate of the P-type transistor TB4 and sets a drain voltage of the P-type transistor TB3 to the reference voltage Vbias. If a power supply voltage is referred to as VDD, Vref<Vbias<VDD is satisfied. Drain voltages of the P-type transistors TB1, TB3, TB5, and TB6 of the current source circuit 120 are set by these amplification circuits AM1 to AM3, and thereby, an accurate bias current can be supplied to the oscillation unit 110.

Next, the oscillation unit 110 will be described.

The capacitor CA3, the vibrator XTAL, and the capacitor CA4 are connected in series between a base and a collector of the bipolar transistor TRA. In addition, the capacitor CA1 is provided in one terminal of the vibrator XTAL, and the capacitor CA2 is provided in the other terminal. a source of the P-type transistor TRPA is connected to a base of the bipolar transistor TRA, and a gate of the P-type transistor TRPA is connected to a collector of the bipolar transistor TRA. A base voltage VBA of the bipolar transistor TRA is output as an oscillation signal OUT. An emitter of the bipolar transistor TRA and a drain of the P-type transistor TRPA are connected to a low-potential side power supply node.

The vibrator XTAL is a piezoelectric vibrator such as a quartz vibrator, or the like. A piezoelectric material, such as, piezoelectric single crystal such as quartz, lithium tantalate, and lithium niobate, and piezoelectric ceramic such as lead zirconate titanate, and the like can be used as a substrate material of the vibrator XTAL.

According to the present embodiment described above, the oscillation circuit 100 includes the bipolar transistor TRA for oscillation, the P-type transistor TRPA, the first current source (P-type transistors TB1 and TB2) that supplies a current to the bipolar transistor TRA, and the second current source (P-type transistors TB3 and TB4) that supplies a current to the P-type transistor TRPA. A collector voltage VCA of the bipolar transistor TRA is input to the gate of the P-type transistor TRPA, and the base of the bipolar transistor TRA is connected to the source of the P-type transistor TRPA.

As such, in the present embodiment, feedback is made between the collector and the base of the bipolar transistor TRA through the source and the gate of the P-type transistor TRPA. Thereby, the collector voltage VCA of the bipolar transistor TRA is lowered by the gate-source voltage of the P-type transistor TRPA, and thereby, an increase of the collector voltage VCA of the bipolar transistor TRA for oscillation can be reduced. By reducing the increase of the collector voltage VCA, the transistor (P-type transistor TB2) of a current source can be used in a saturation region, and variation of an oscillation frequency due to variation of the power supply voltage can be reduced.

Figure 5:
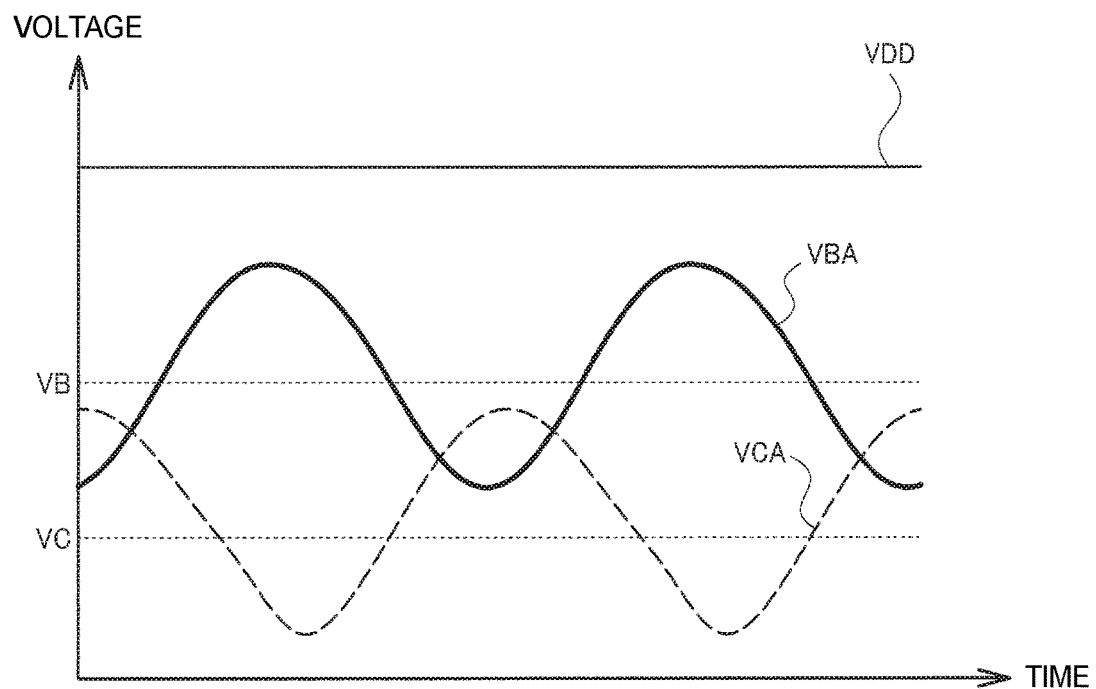
FIG. 5 is a waveform example of a collector voltage and a base voltage of a bipolar transistor in the present embodiment.

FIG. 5 is a waveform example of the collector voltage and the base voltage of the bipolar transistor TRA when the vibrator XTAL oscillates.

The collector voltage VCA has a sine wave having the operation point voltage VC as a reference (center), and the base voltage VBA has a sine wave having the operation point voltage VB as a reference. The collector voltage VCA and the base voltage VBA are substantially opposite in phase. As illustrated in FIG. 4, when the gate-source voltage of the P-type transistor TRPA is referred to as VGS, the operation point voltage of the collector is VC=VB−VGS.

As such, in the present embodiment, the operation point voltage VC of the collector is lower than the operation point voltage VB of the base by the gate-source voltage VGS of the P-type transistor TRPA. Accordingly, a difference between the maximum value (peak value of the sine wave) of the collector voltage VCA and the power supply voltage VDD can become larger than in the comparative example of FIG. 1. For example, even in a case where the power supply voltage VDD is lowered, it is possible to secure the source-drain voltage of the transistor TB2 of a current source near the maximum value of the collector voltage VCA, and to reduce a possibility that the transistor TB2 performs a linear operation.

Figure 6:
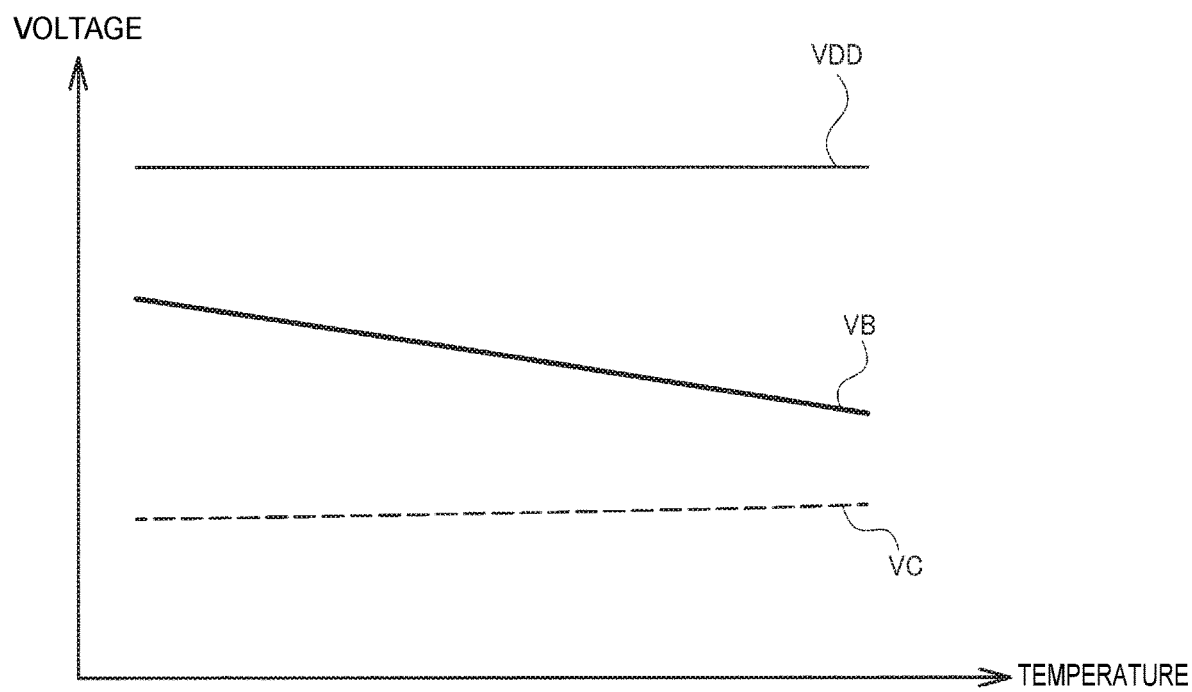
FIG. 6 is a temperature characteristic example of operation point voltages of a collector and a base of the bipolar transistor in the present embodiment.

FIG. 6 illustrates a temperature characteristic example of the operation point voltages of the collector and the base of the bipolar transistor TRA.

As illustrated in FIG. 6, the operation point voltage VB of the base of the bipolar transistor TRA has a negative temperature characteristic. In addition, the gate-source voltage VGS of the P-type transistor TRPA also has a negative temperature characteristic. As described above, since the operation point voltage of the collector is VC=VB−VGS, a slope (voltage change rate) of the temperature characteristic of the operation point voltage VC of the collector is smaller than a slope of the temperature characteristic of the operation point voltage VB of the base. For example, by adjusting the temperature characteristic of the operation point voltage VB of the base of the bipolar transistor TRA and the temperature characteristic of the gate-source voltage VGS of the P-type transistor TRPA to the same extent, the temperature characteristic of the operation point voltage VC of the collector can be approximately flat. That is, since the operation point voltage VC of the collector is hard to be influenced by the temperature characteristic of the operation point voltage VB of the base, a voltage is stabilized with respect to a temperature change. Thus, even if a temperature change occurs, an increase of the collector voltage VCA described in the comparative example can be reduced in the present embodiment.

As such, in the present embodiment, the temperature characteristic of the operation point voltage VB of the base of the bipolar transistor TRA can be reduced by using the temperature characteristic of the gate-source voltage VGS of the P-type transistor TRPA. Thereby, a possibility that the transistor TB2 of a current source performs a linear operation in a temperature range which is used by the oscillation circuit 100, can be reduced (a temperature region where there is a possibility of a linear operation can be eliminated).

2. Modification Example

Figure 7:
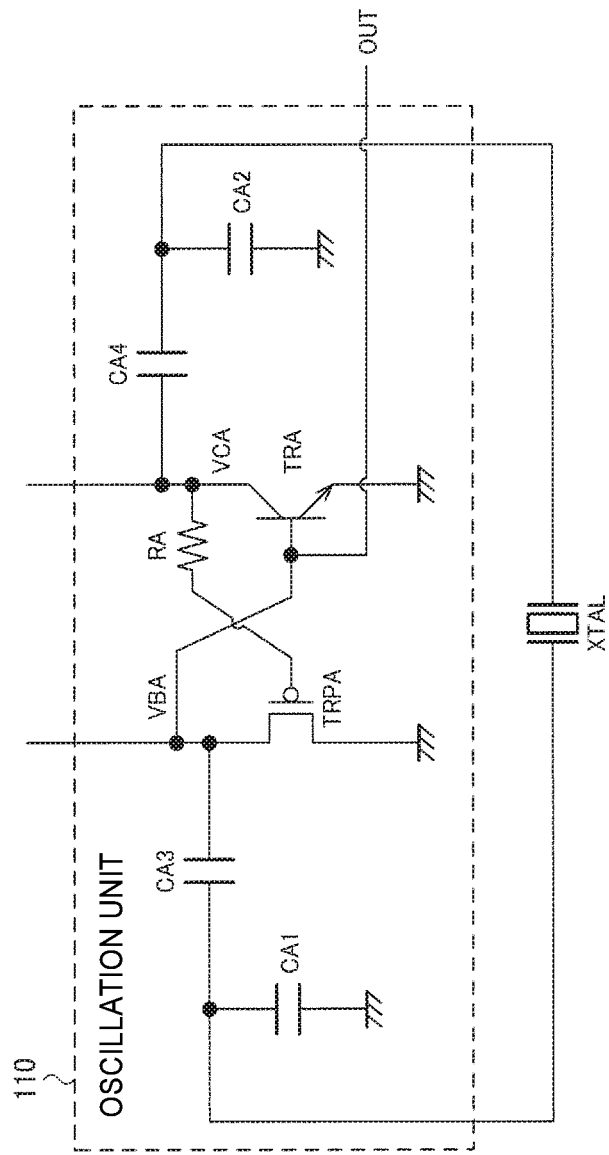
FIG. 7 is a first modification example of an oscillation unit.

FIG. 7 illustrates a first modification example of the oscillation unit. In FIG. 7, the oscillation unit 110 further includes a resistor RA. The resistor RA is provided between the collector of the bipolar transistor TRA and the gate of the P-type transistor TRPA. That is, one terminal of the resistor RA is connected to the collector of the bipolar transistor TRA, and the other terminal thereof is connected to the gate of the P-type transistor TRPA.

Impedance between the collector and the base of the bipolar transistor TRA relates to an oscillation characteristic (for example, negative resistance, stability of an oscillation loop, and the like) of the oscillation circuit 100. Accordingly, by providing the resistor RA between the collector of the bipolar transistor TRA and the gate of the P-type transistor TRPA, the oscillation characteristic (a part thereof) may be improved. For example, as the impedance between the collector and the base is increased by the resistor RA, negative resistance increases. Thereby, there is a case where amplitude of an oscillation signal can be increased.

In the embodiment of FIG. 4 and FIG. 7, a size of the bipolar transistor TRA, a size of the P-type transistor TRPA, and bias current flowing through the transistors are determined (designed) in consideration of negative resistance, stability of an oscillation loop, and the like. In FIG. 7, a resistance value of the resistor RA is further added to design elements.

Figure 8:
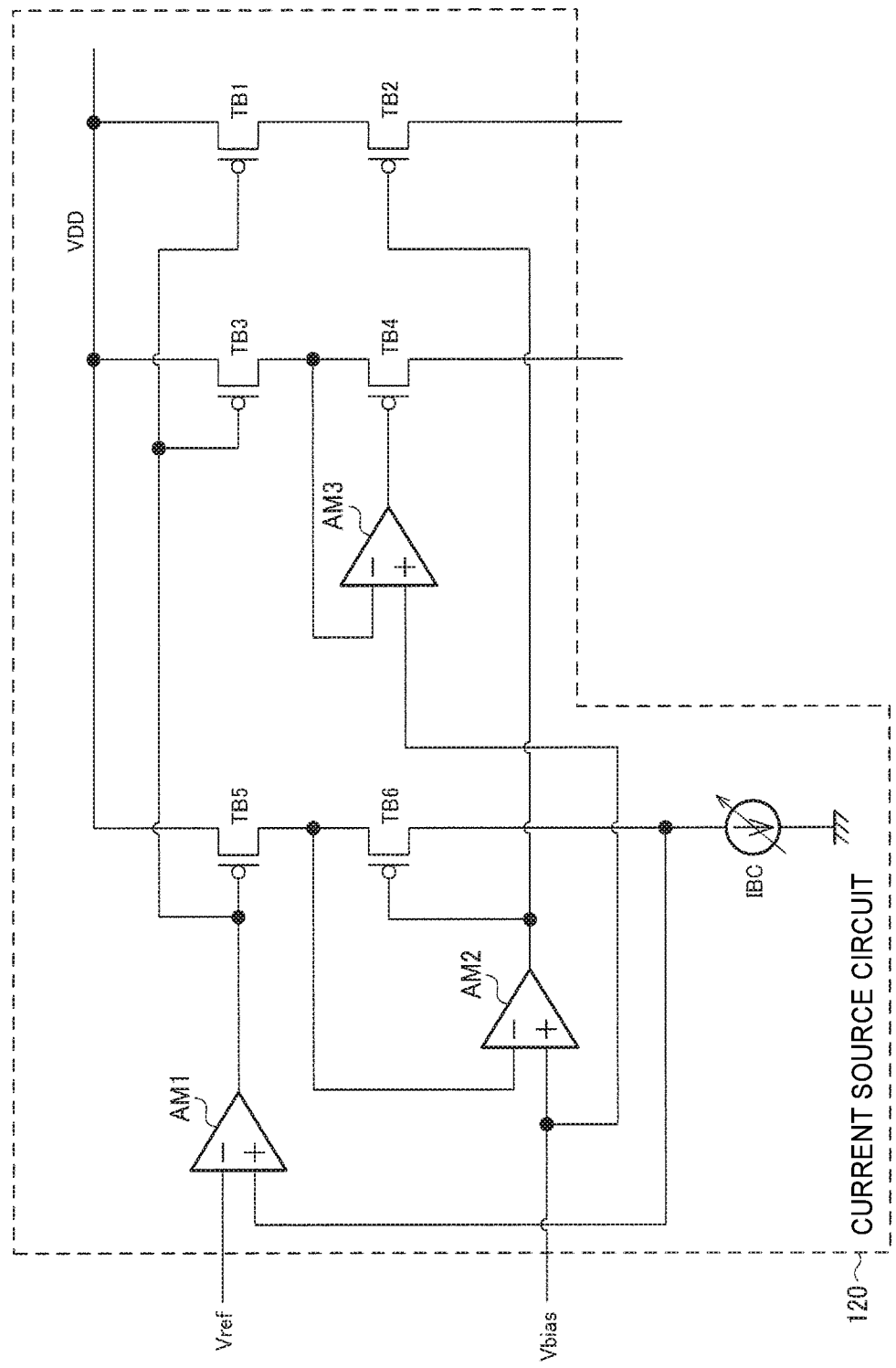
FIG. 8 is a modification example of a current source circuit.

FIG. 8 illustrates a modification example of the current source circuit. In FIG. 8, the current source IBB of FIG. 4 is changed to a variable current source IBC. In the present modification example, the bias current generated by the variable current source IBC is variably adjusted, and thereby, a source current (current flowing between the source and the drain) of the P-type transistor TRPA of the oscillation unit 110 is variably adjusted.

As described above, the operation point voltage VB of the base (source of the P-type transistor TRPA) is higher than the operation point voltage VC of the collector of the bipolar transistor TRA. Accordingly, a margin in which the transistor TB4 of a current source can maintain an operation in the saturation region is smaller than a margin in which the transistor TB2 of a current source can maintain an operation in the saturation region.

In the present modification example, the operation point voltage VB of the base of the bipolar transistor TRA (source of the P-type transistor TRPA) can be changed by changing the source current of the P-type transistor TRPA. Thereby, the operation point voltage VB of the base of the bipolar transistor TRA can be appropriately set in accordance with the margin in which the transistor TB4 of a current source can maintain an operation in the saturation region. It is possible to set the optimum operation point voltage VB while considering, for example, an oscillation characteristic of the oscillation circuit 100 and power consumption.

In addition, in the present modification example, the source current of the P-type transistor TRPA is variably adjusted based on the power supply voltage VDD.

Specifically, the variable current source IBC is adjusted such that a drain current of the P-type transistor TRPA is smaller as the power supply voltage VDD is lower. Thereby, the lower the power supply voltage VDD, the lower the operation point voltage VB of the base of the bipolar transistor TRA (source of the P-type transistor TRPA). Accordingly, in a case where the voltage is lowered, a possibility that the transistor TB4 of a current source performs a linear operation can be reduced.

A current value of the bias current generated by the variable current source IBC is set by, for example, register setting from a processing device (processing device provided outside a circuit device including an oscillation circuit). Alternatively, the current value of the bias current may be variably adjusted in the oscillation circuit. For example, the oscillation circuit may include a detection circuit that detects the power supply voltage VDD and a control circuit that controls the variable current source IBC, based on detection results.

Figure 9:
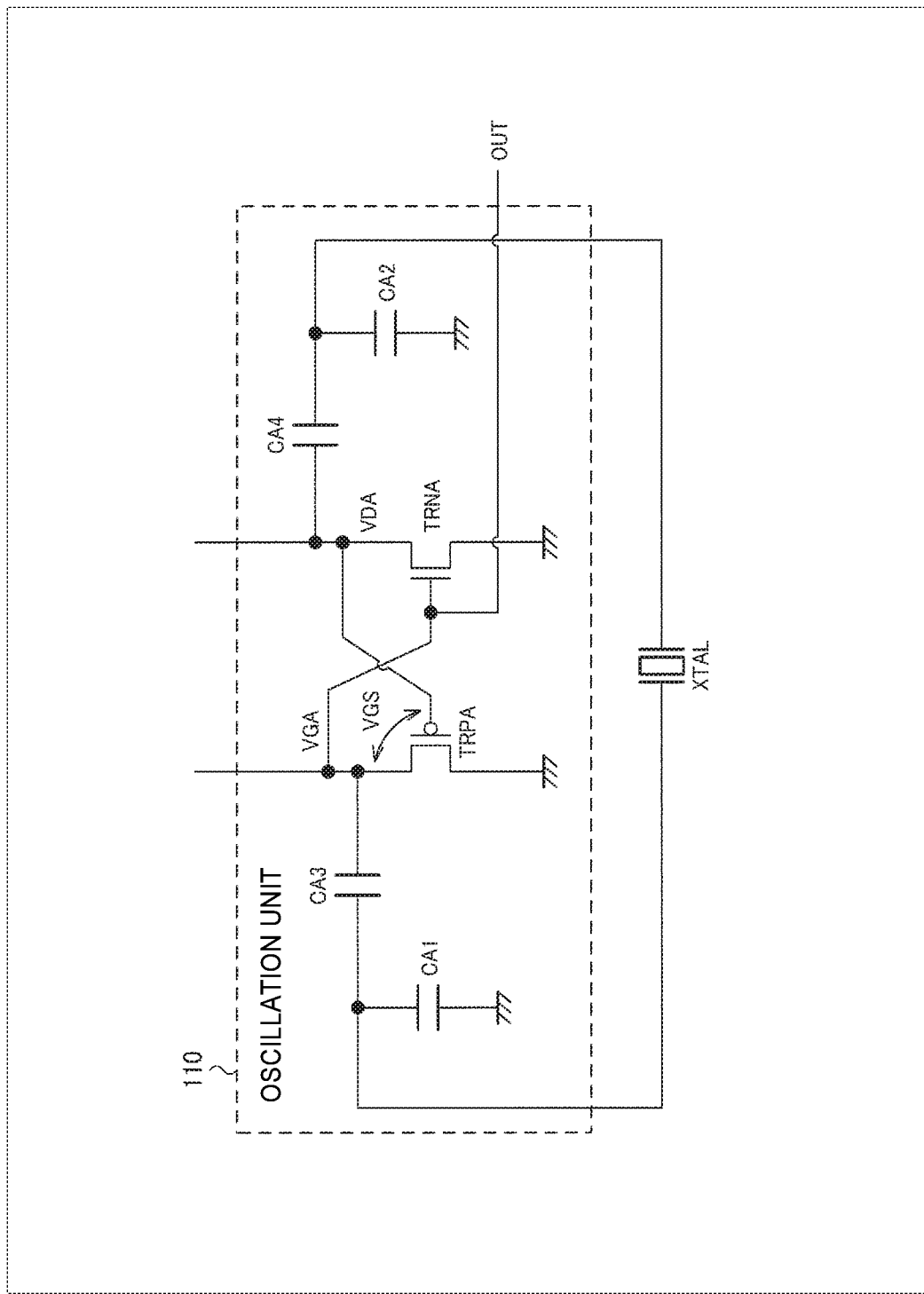
FIG. 9 is a second modification example of the oscillation unit.

FIG. 9 illustrates a second modification example of the oscillation unit. In FIG. 9, the bipolar transistor TRA in FIG. 4 is changed to an N-type transistor TRNA (second conductive type MOS transistor). A drain of the N-type transistor TRNA is connected to the gate of the P-type transistor TRPA, and a gate of the N-type transistor TRNA is connected to the source of the P-type transistor TRPA. A source of the N-type transistor TRNA is connected to a low potential side power supply node.

In the same manner as in a case of using the bipolar transistor, even in a case where an N-type transistor is used, there is a possibility that the transistor of a current source performs a linear operation, if a drain voltage thereof increases.

In this regard, the oscillation circuit 100 including the oscillation unit 110 according to the present modification example includes the N-type transistor TRNA for oscillation, the P-type transistor TRPA, the first current source (P-type transistors TB1 and TB2 in FIG. 4) that supplies a current to the N-type transistor TRNA, and a second current source (P-type transistors TB3 and TB4) that supplies a current to the P-type transistor TRPA. A drain voltage VDA of the N-type transistor TRNA is input to the gate of the P-type transistor TRPA, and the source of the P-type transistor TRPA is connected to the gate of the N-type transistor TRNA. That is, the source voltage of the P-type transistor TRPA is input as a gate voltage VGA of the N-type transistor TRNA.

In the present modification example, in a case where a drain operation point voltage of the N-type transistor TRNA is referred to as VD, a gate operation point voltage of the N-type transistor TRNA is referred to as VG, and a gate-source voltage of the P-type transistor TRPA is referred to as VGS, VD=VG−VGS. As such, since the drain operation point voltage VD of the N-type transistor TRNA is lower than the gate operation point voltage VG of the N-type transistor TRNA, a possibility that the transistor TB2 of a current source performs a linear operation can be reduced.

In the above description, a case where a P-type transistor is provided between the collector and the base of the bipolar transistor TRA is described as an example, and the invention is not limited to this. That is, the oscillation circuit 100 may include the bipolar transistor TRA for oscillation and a circuit element provided between the collector and the base of the bipolar transistor TRA. A base-emitter voltage of the bipolar transistor TRA is a voltage with one temperature characteristic (for example, positive temperature characteristic) of a positive temperature characteristic and a negative temperature characteristic, and the circuit element generates a voltage of the other temperature characteristic (for example, a negative temperature characteristic) of the positive temperature characteristic and the negative temperature characteristic between the collector and the base. The circuit element may be, for example, a P-type transistor as illustrated in FIG. 4 or the like, but is not limited to this, and may be an element that generates a voltage with a negative temperature characteristic between the collector and the base of the bipolar transistor TRA.

By doing so, a temperature characteristic of the operation point voltage of the base of the bipolar transistor (temperature characteristic of a base-emitter voltage of the bipolar transistor) can be reduced by using the temperature characteristic of the voltage generated between the collector and the base of the bipolar transistor by the circuit element. Thereby, a possibility that the transistor of a current source performs a linear operation in a temperature range which is used by the oscillation circuit can be reduced.

3. Circuit Device

Figure 10:
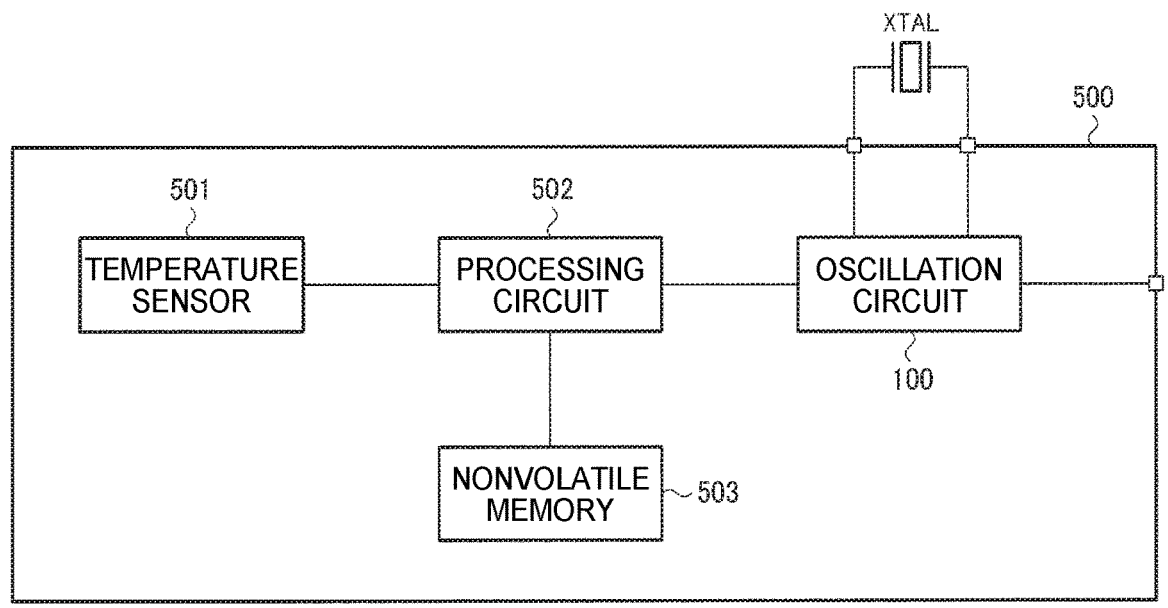
FIG. 10 is a configuration example of a circuit device.

FIG. 10 illustrates a configuration example of the circuit device including the oscillation circuit according to the present embodiment. A circuit device 500 includes a temperature sensor 501, a processing circuit 502, a nonvolatile memory 503, and an oscillation circuit 100. The circuit device 500 is realized by, for example, an integrated circuit device.

The temperature sensor 501 detects an environmental temperature of the circuit device (for example, temperature of a substrate of the integrated circuit device), and outputs a temperature detection signal. The processing circuit 502 includes an A/D conversion circuit that performs A/D conversion of a temperature detection signal into temperature detection data, and a control circuit that outputs control data, based on the temperature detection data. The nonvolatile memory 503 stores temperature compensation data for canceling (suppressing) a temperature characteristic of an oscillation frequency. The temperature compensation data is table data in which control data is associated with each temperature. The control circuit reads temperature control data corresponding to the temperature detection data from the nonvolatile memory 503 and outputs the temperature control data. The oscillation circuit 100 includes a capacitor array, and the oscillation frequency is temperature-compensated as a capacitance value of the capacitor array is controlled (selected) by the control data.

The configuration of the circuit device is not limited to the above description, and various modifications such as omitting a part of configuration elements thereof or adding other configuration elements can be made.

For example, the processing circuit 502 includes an A/D conversion circuit and a DSP, and the nonvolatile memory 503 may store coefficient data of a polynomial that cancels (suppresses) the temperature characteristic of the oscillation frequency. In this case, the DSP generates control data, based on the temperature detection data and the polynomial. The oscillation circuit 100 includes a D/A conversion circuit that performs D/A conversion of the control data and a variable capacitance element whose capacitance value changes according to an output voltage of the D/A conversion circuit, and as the capacitance value of the variable capacitance element changes, the oscillation frequency is temperature-compensated.

Alternatively, the processing circuit 502 may be an analog temperature compensation circuit that generates a control voltage which cancels (suppresses) the temperature characteristic of the oscillation frequency, based on the temperature detection signal. In this case, the oscillation circuit 100 includes a variable capacitance element whose capacitance value varies depending on the control voltage.

Alternatively, a case where the circuit device 500 is a circuit device of a temperature compensated crys(X)tal oscillator (TCXO) is described as an example in above description, but the circuit device 500 may be a simple packaged crys(X)tal oscillator (SPXO). In this case, for example, the processing circuit 502 is a control circuit that performs operation setting and the like of the oscillation circuit 100, and the temperature sensor 501 and the nonvolatile memory 503 may be omitted.

4. Oscillator, Electronic Apparatus, and Vehicle

Figure 11:
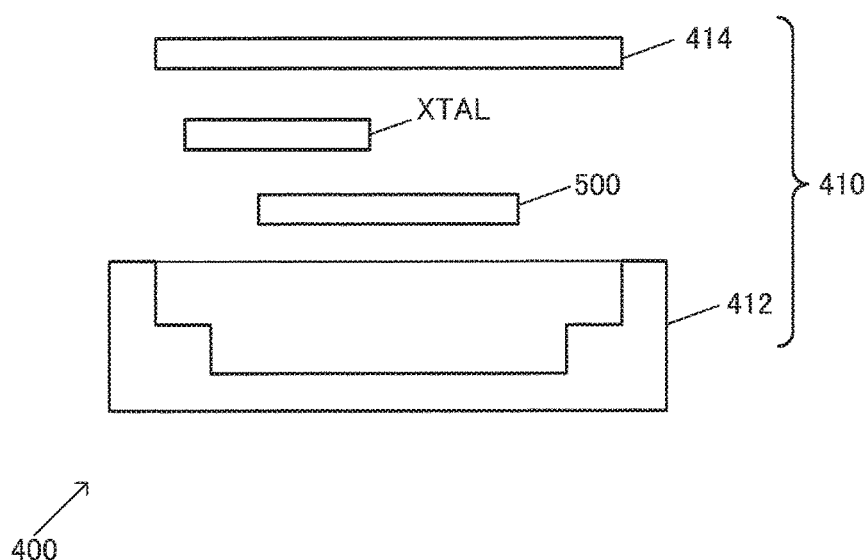
FIG. 11 is a configuration example of an oscillator.

FIG. 11 illustrates a configuration example of an oscillator 400 including the oscillation circuit according to the present embodiment. The oscillator 400 includes the circuit device 500 and the vibrator XTAL (vibrator, resonation element). The circuit device 500 includes the oscillation circuit according to the present embodiment. In addition, the oscillator 400 can also include a package 410 in which the circuit device 500 and the vibrator XTAL are contained. The oscillator is not limited to the configuration of FIG. 11, and various modifications such as omitting apart of configuration elements thereof and adding other configuration elements can be made.

The package 410 is configured by, for example, abase portion 412 and a lid portion 414. The base portion 412 is, for example, a member of a box type or the like formed of an insulation material such as ceramic, and the lid portion 414 is a member of, for example, a flat plate shape or the like bonded to the base portion 412. An external connection terminal (external electrode) for being connected to an external device is provided on, for example, a bottom surface of the base portion 412. The circuit device 500 and the vibrator XTAL are contained in an internal space (cavity) formed by the base portion 412 and the lid portion 414. The circuit device 500 and the vibrator XTAL are hermetically sealed in the package 410 by being hermetically sealed by the lid portion 414. The circuit device 500 and the vibrator XTAL are mounted inside the package 410. Terminals of the vibrator XTAL and terminals (pads) of the circuit device 500 (IC) are electrically connected to each other by internal wires of the package 410.

Figure 12:
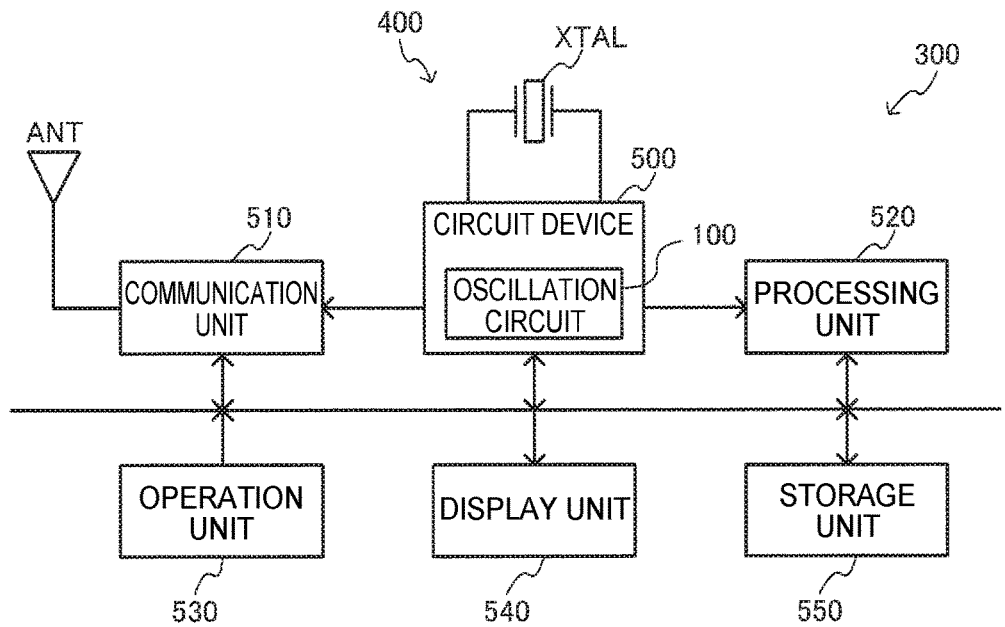
FIG. 12 is a configuration example of an electronic apparatus.

FIG. 12 illustrates a configuration example of an electronic apparatus 300 including the oscillation circuit according to the present embodiment. The electronic apparatus 300 includes the circuit device 500, the vibrator XTAL such as a crystal vibrator, an antenna ANT, a communication unit 510 (communication device), and the processing unit 520 (processing device). The circuit device 500 includes the oscillation circuit 100 according to the present embodiment. In addition, the electronic apparatus 300 can include an operation unit 530 (operation device), a display unit 540 (display device), and a storage unit 550 (memory). The oscillator 400 is configured by the vibrator XTAL and the circuit device 500. A configuration of the electronic apparatus 300 is not limited to the configuration of FIG. 12, and various modifications such as omitting a part of the configuration elements thereof and adding other configuration elements can be made.

For example, an in-vehicle electronic apparatus such as an electronic control unit (ECU) or a meter panel, an image device such as a digital camera or a video camera, or a printing device such as a printer or a printer composition machine can be used as the electronic apparatus 300 in FIG. 12. Alternatively, various apparatuses, such as, a wearable device such as a GPS built-in timepiece, a biological information measurement device (pulse wave meter, pedometer, or the like) or a head-mounted display, a portable information terminal (mobile terminal) such as a smartphone, a cellular phone, a portable game device, a notebook PC or a tablet PC, a content providing terminal that delivers contents, or a network relating device such as a base station or a router, can be used as the electronic apparatus.

The communication unit 510 (wireless circuit) receives data from the outside through the antenna ANT and performs processing of transmitting the data to the outside. The processing unit 520 performs control processing of the electronic apparatus 300 and various digital processing of data transmitted and received through the communication unit 510. A function of the processing unit 520 can be realized by a processor such as a microcomputer. The operation unit 530 is for the user to perform an input operation, and can be realized by operation buttons, a touch panel display, and the like. The display unit 540 displays various kinds of information and can be realized by a display such as liquid crystal or organic EL. The storage unit 550 stores data, and a function thereof can be realized by a semiconductor memory such as a RAM or a ROM, a hard disk drive (HDD), and the like.

Figure 13:
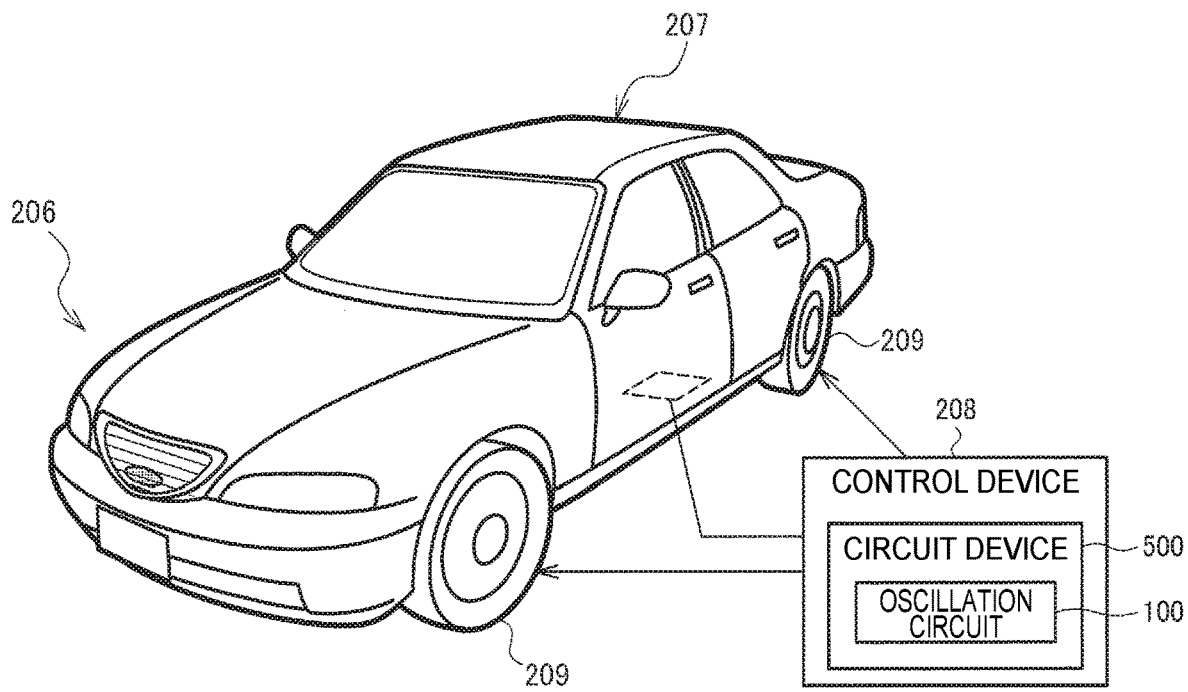
FIG. 13 is a configuration example of a vehicle.

FIG. 13 illustrates an example of a vehicle including the oscillation circuit according to the present embodiment. The circuit device 500 (oscillator) according to the present embodiment can be incorporated into various vehicles such as a car, an airplane, a motorcycle, a bicycle, and a ship. The vehicle includes, for example, a drive mechanism such as an engine or a motor, a steering mechanism such as a steering wheel or a rudder, and various electronic apparatuses (in-vehicle devices), and is an apparatus or a device that moves on the ground, the sky or the sea.

FIG. 13 schematically illustrates an automobile 206 as a specific example of the vehicle. An oscillator (not illustrated) including the circuit device 500 and the vibrator according to the present embodiment is incorporated into the automobile 206. The circuit device 500 includes the oscillation circuit 100 according to the present embodiment. A control device 208 operates based on a clock signal (oscillation signal) generated by the oscillator. For example, the control device 208 may control hardness of a suspension according to a posture of a vehicle body 207, or may be an ECU that controls brakes of individual wheels 209. For example, automatic driving of the vehicle 206 may be realized by the control device 208. The oscillation circuit, the circuit device, and a device into which the oscillator is incorporated, according to the present embodiment, are not limited to the control device 208, and can be incorporated into various apparatuses (in-vehicle apparatuses) provided in a vehicle such as the automobile 206.

Although the present embodiment is described in detail as above, it will be easily understood by those skilled in the art that many modifications can be made without substantially departing from the novel matters and effects of the invention. Thus, all the modification examples are included in the scope of the invention. For example, in the specification or drawings, a term described at least once together with a different term that is broader or equivalent can be replaced with a different term at any point in the specification or the drawings. In addition, all combinations of the present embodiment and modification example are also included in the scope of the invention. In addition, the configurations, the operations, and the like of the oscillation circuit, the circuit device, the oscillator, the electronic apparatus, and the vehicle are not also limited to those described in the present embodiment, and various modifications can be made.

The entire disclosure of Japanese Patent Application No. 2017-051053, filed Mar. 16, 2017 is expressly incorporated by reference herein.

What is claimed is:

1. An oscillation circuit that causes a vibrator to oscillate, comprising:
   a bipolar transistor for oscillation;
   a P-type transistor having a gate to which a collector voltage of the bipolar transistor is input and a source to which a base of the bipolar transistor is connected;
   a first current source that supplies a first current to the bipolar transistor; and
   a second current source that supplies a second current to the P-type transistor.

2. The oscillation circuit according to claim 1,
   wherein, when an operation point voltage of the base of the bipolar transistor is referred to as VB, an operation point voltage of a collector of the bipolar transistor is referred to as VC, and a gate-source voltage of the P-type transistor is referred to as VGS, VC=VB−VGS.

3. The oscillation circuit according to claim 1,
   wherein the operation point voltage of the base of the bipolar transistor has a negative temperature characteristic, and
   wherein the gate-source voltage of the P-type transistor has a negative temperature characteristic.

4. The oscillation circuit according to claim 1, further comprising:
   a resistance element that is provided between the collector of the bipolar transistor and the gate of the P-type transistor.

5. The oscillation circuit according to claim 1,
   wherein a source current of the P-type transistor is variably adjusted.

6. The oscillation circuit according to claim 5,
   wherein the source current is variably adjusted based on a power supply voltage.

7. An oscillation circuit that causes a vibrator to oscillate, comprising:
   an N-type transistor for oscillation;
   a first P-type transistor having a gate to which a drain voltage of the N-type transistor is input and a source to which a gate of the N-type transistor is connected;
   a first current source that supplies a current to the N-type transistor, the first current source including a second P-type transistor and a third P-type transistor that are connected in series, and the first current source being connected to a drain of the N-type transistor; and a second current source that supplies a current to the first P-type transistor, the second current source including a fourth P-type transistor and a fifth P-type transistor that are connected in series, and the second current source being connected to the source of the first P-type transistor.

8. An oscillation circuit that causes a vibrator to oscillate, comprising:

a bipolar transistor for oscillation; and a circuit element that is provided between a collector and a base of the bipolar transistor, wherein a base-emitter voltage of the bipolar transistor is a voltage having one temperature characteristic of a positive temperature characteristic and a negative temperature characteristic, and the circuit element generates a voltage having the other temperature characteristic between the collector and the base.

9. A circuit device comprising:
the oscillation circuit according to claim 1.

10. A circuit device comprising:
the oscillation circuit according to claim 7.

11. A circuit device comprising:
the oscillation circuit according to claim 8.

12. The circuit device according to claim 9, further comprising:
a processing circuit that controls the oscillation circuit.

13. An oscillator comprising:
the oscillation circuit according to claim 1; and
the vibrator.

14. An oscillator comprising:
the oscillation circuit according to claim 7; and
the vibrator.

15. An oscillator comprising:
the oscillation circuit according to claim 8; and
the vibrator.

16. An electronic apparatus comprising:
the oscillation circuit according to claim 1.

17. An electronic apparatus comprising:
the oscillation circuit according to claim 7.

18. An electronic apparatus comprising:
the oscillation circuit according to claim 8.

19. A vehicle comprising:
the oscillation circuit according to claim 1.

20. A vehicle comprising:
the oscillation circuit according to claim 7.

* * * * *